United States Patent [19]

Hughes et al.

[11] Patent Number: 5,400,273
[45] Date of Patent: Mar. 21, 1995

[54] ANALOG CURRENT MEMORY

[75] Inventors: John B. Hughes, Hove; Kenneth W. Moulding, Horley, both of England

[73] Assignee: U.S. Philips Corporation, New York, N.Y.

[21] Appl. No.: 186,397

[22] Filed: Jan. 25, 1994

[30] Foreign Application Priority Data

Jan. 26, 1993 [GB] United Kingdom ............... 9301463

[51] Int. Cl.$^6$ ............................................ G11C 13/00
[52] U.S. Cl. ........................................ 365/45; 365/233
[58] Field of Search ................. 365/45, 233, 189.01, 365/230.01

[56] References Cited

U.S. PATENT DOCUMENTS 3,315,236 4/1967 Hewlett .............................. 365/45

OTHER PUBLICATIONS

"A Switched Current Technique for High Performance", *Electronics Letters*, Vol. 29, No. 16, 5 Aug. 1993, Stevenage GB, pp. 1400–1401, (Hughes et al).

Primary Examiner—Terrell W. Fears
Attorney, Agent, or Firm—Steven R. Biren

[57] ABSTRACT

An analogue current memory arrangement includes an input (30) and an output (33). A first (coarse) current memory cell (T31,S31,C31) senses the input current during clock phase $\phi1a$ and reproduces the sensed current during clock phases $\phi1b$ and $\phi2$. A second (fine) current memory cell (T32,C32,S32) acts as a current source during phase $\phi1a$ when a reference voltage (VR) is applied to the gate of transistor (T32). The second current memory cell senses the difference between the input current and the output of the first current memry cell during phase $\phi1b$ and reproduces the sensed current during phase $\phi2$.

During phase $\phi2$ the input switch (S30) is opened and the output switch (S34) is closed causing the combined outputs of the first and second current memory cells to be fed to the output (33).

(FIGS. 3 and 4).

4 Claims, 2 Drawing Sheets

ANALOG CURRENT MEMORY

The invention relates to an analog current memory arrangement.

Analog current memory arrangements are a key component of a class of circuits known as switched current circuits which were disclosed by J. B. Hughes, N. C. Bird and I. C. Macbeth in "Switched Currents—A New Technique for Sampled-Data Signal Processing", IEEE International Symposium on Circuits and Systems, 1989, pp 1584–1587. In that publication a current memory cell which comprised a simple MOS current mirror circuit having a switch connected between the gate electrodes of the two transistors was disclosed. The arrangement was such that the switch was controlled by a clock signal which closed the switch on one phase during which the input current was sensed and opened the switch on the other phase which caused the current sensed during the first phase to be reproduced during the other phase since the required gate-source potential for the output transistor is stored on its gate-source capacitance (and any other capacitance which may be connected in parallel therewith). This current memory arrangement suffered from a number of disadvantages which limited its performance. In particular matching inaccuracies between the two transistors cause an error in the output current.

To overcome the problem of matching inaccuracies an alternative current memory was developed which comprised a single MOS transistor having a switch between its gate and drain electrodes. The switch again was closed during one phase of a clock signal during which an input current was sensed and opened during the other phase of the clock signal at which time an output current was produced as a result of the charge stored on the gate-source capacitance of the transistor. Since the same device is used for sensing the input current and producing the output current device mismatching is eliminated. This alternative current memory does, however, have a number of limitations. These include conductance ratio errors and charge injection errors.

The current memories are used in switch current signal processing arrangements to produce functional blocks such as integrators, differentiaters, delay lines, etc. The analog performance of the signal processing arrangements will be directly affected by errors produced by the current memory cells. The errors generated by the basic memory cell are such that a switched current signal processing system using them has inadequate precision and linearity for most applications. As a result efforts have been made by means of various circuit enhancements to improve the performance of the basic current memory cell. These include the use of negative feedback techniques to reduce the conductance ratio errors and charge injection cancellation techniques including the use of dummy switches and the adoption of fully differential circuits.

It is an object of the invention to enable the construction of a current memory arrangement having an improved performance over the basic current memory cell without introducing some of the limitations of the circuit enhancement techniques hitherto used.

The invention provides an analog current memory arrangement comprising an input for receiving an input current, an output for an output current reproducing the input current or a current related thereto, first and second current memory cells, and current combining means, wherein; the first current memory cell comprises means for sensing the input current during a first sub-portion of a first portion of a clock period and means for reproducing the sensed current as an output current during a second sub-portion of the first portion of the clock period, the second current memory cell comprises means for sensing the sum of the input current and the output current of the first current memory cell during the second sub-portion, the first and second current memory cells comprise means for reproducing the currents sensed at their inputs to produce first and second output sub-currents during at least one of a second later portion of the clock period and during a later clock period, the current combining means is arranged to combine the first and second output sub-currents and means are provided for applying the combined sub-currents to the current output.

The invention is based on a two-step process where a first (coarse) memory cell senses the input current during the first sub-portion of the input portion of a clock signal controlled period and a second (fine) memory cell senses the difference between the input current and the current stored in the first current memory cell during the second sub-portion. During the output portion the outputs of both current memory cells are combined to produce an output current substantially equal to the input current, the errors being reduced by the two step process. The input sub-portions and output portion do not have to be within a single clock period and in particular the input portion could be separated from the output portion by a plurality of clock periods. The limitation with regard to the separation of the input and output times is the period for which the memory cell can maintain the output current. As this is normally determined by the charge on a capacitor this time will be dependent on the rate of leakage of charge from the capacitor.

The first and second memory cells may each comprise an MOS transistor having its gate and drain electrodes coupled via a switch, the switch being responsive to the clock signal, each cell operating to sense an input current when its associated switch is closed and produce an output current when its associated switch is open.

This provides a simple implementation with the charge on the gate-source capacitance established when the transistor is diode connected to sense the input current being effective to maintain the current through the transistor when the switch is opened and produce the equivalent output current. It is, of course, possible to add additional capacitance if a "memory" capacitance greater than that of the intrinsic source-gate capacitance is desired. The use of a simple current memory cell is advantageous in reducing the voltage headroom required enabling low power supply voltages compatible with those used or proposed in digital VLSI processes.

The second current memory cell may be arranged to provide a constant bias current during the first sub-portion, the bias current being fed together with the input current to the first memory cell.

This enables input currents of both polarities to be processed, up to the value of the bias current, and minimizes the components required to produce the bias current. That is, it uses the fine memory cell to produce the bias current during the first sub-portion.

The second current memory cell may comprise means for connecting the gate electrode of the transistor in the second current memory cell to a bias potential source during the first sub-portion.

This enables the second current memory cell to function both in that capacity and as purely a current source during the first sub-portion. This can be achieved merely by providing a switch which is closed only during that first sub-portion which connects a bias voltage to the gate of the transistor.

The above and other features and advantages of the invention will become apparent from the following description of detailed embodiments of the invention, by way of example, with reference to the accompanying drawings, in which.

Figure 1:
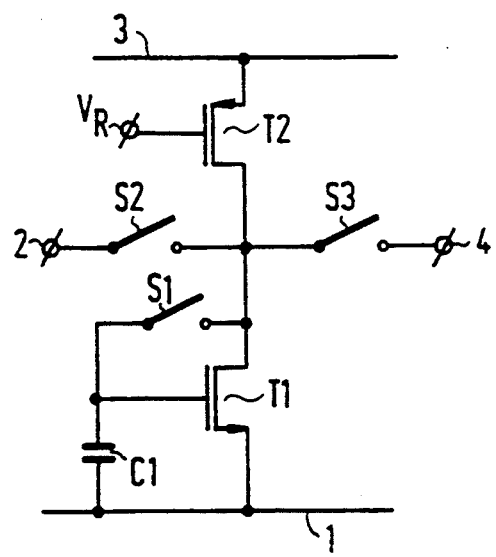
FIG. 1 is a circuit diagram of a known analogue current memory cell.

FIG. 1 is a circuit diagram of a known basic current memory cell which comprises an nMOS transistor T1 whose source electrode is connected to a negative supply rail 1 and whose drain electrode is connected to its gate electrode via a switch S1. A capacitor C1, which may be formed by the gate-source capacitance of transistor T1 is connected between the gate and source electrodes of transistor T1. An input 2 is connected via a switch S2 to the drain electrode of transistor T1 and also to the drain electrode of a pMOS transistor T2 whose source electrode is connected to a positive supply rail 3, the gate electrode of transistor T2 is connected to a reference voltage $V_R$. A third switch S3 connects the junction of the drain electrodes of transistors T1 and T2 to the output 4.

The current memory cell shown in FIG. 1 has its switches S1 to S3 controlled by a clock signal on one phase $\phi_1$ of which switches S1 and S2 are closed and on the other phase $\phi_2$ of which switch S3 is closed. Thus, in operation, on phase $\phi_1$ of the clock an input current i and a bias current j produced by the transistor T2 flow into the drain electrode of transistor T1 which is diode connected. This causes capacitor C1 to become charged to the gate source voltage of transistor T1. When switches S1 and S2 open at the end of phase $\phi_1$ transistor T1 passes a current nominally equal to the current sensed (i+j) during phase $\phi_1$ because the charge stored on capacitor C1 causes the gate potential to be maintained. Consequently when switch S3 closes during clock phase $\phi_2$ an output current io is produced which is equal to $j-(i+j)=-i$. Thus the input current i during phase $\phi_1$ is reproduced as an inverted output current io during phase $\phi_2$. Clearly the phases $\phi_1$ and $\phi_2$ can be separated by any desired interval, assuming no leakage of the charge from capacitor C1, and two such current memory cells may be connected in cascade to produce a clock period delay from input to output.

As discussed in the introduction this current memory cell has the advantage that there are no errors produced due to transistor mismatch since the same device is used both for sensing the input current and producing the output current. There are, however, other errors which are produced, one being conductance ratio error. During phase $\phi_2$ when the cell delivers output current to its load the drain voltage of transistors T1 and T2 may change from that occurring during phase $\phi_1$ when the input current is sensed. This causes an error in the output current due to channel length modulation and capacitive feedback to the memory capacitance (C1) via the gate-drain overlap capacitance.

A further source of error is charge injection. At the end of phase $\phi_1$ the switch S1 is opened and during this process charge is fed through the switch transistor's gate-channel and drain-gate overlap capacitances into the memory capacitor C1. Switches S1 to S3 will, of course, be implemented as MOS transistors. The resultant disturbance of the gate voltage of transistor T1 causes an error in the memory transistor's (T1) drain current during phase $\phi_2$.

Cells designed for high bandwidth have shorter channel length and this results in both channel length modulation and capacitive feedback effects being larger. The higher transconductance value necessitates a higher value of switch on-conductance to ensure monotonic settling and this results in higher charge injection. As a result both conductance ratio errors and charge injection increase with bandwidth.

Various circuit enhancements have been proposed to improve analog performance and in particular negative feedback techniques have been used to stabilize the drain voltage of the memory transistor T1 and consequently reduce the conductance ratio error. The feedback has been used either to stabilize the cell's input voltage by the use of a grounded-source amplifier or a grounded-gate amplifier or to buffer the memory transistor's drain from external voltage variations by using a variety of cascoding techniques. These measures have enabled a reduction in conductance ratio errors by orders of magnitude but have an inevitable penalty of increased silicon area and power dissipation. Further, where voltage headroom is used by extra transistors, low supply voltage (1.5V or 3V) operation may be impossible. The more complex feedback loops can produce third order systems and this reduces available bandwidth.

Various other enhancements have been proposed to reduce charge injection errors. The most common is the use of dummy switches whose gates are driven by inverted clock signals in an attempt to inject equal and opposite charge into the memory capacitor. For this technique to succeed the switch charge must split equally between its terminals so that exactly half of its total charge flows into the memory capacitor. Unfortunately this requirement is sometimes difficult to meet in practice. Further, since small transistors are used to make the switch and dummy to minimise charge injection, the matching of transistor charges may be poor and this may lead to only a modest reduction in charge injection. Fully differential circuits have lower charge injection and may be used in conjunction with dummy switches to give a further reduction in charge injection. Despite these enhancements charge injection remains a significant source of error in switched current circuits, particularly those with high bandwidths.

Figure 2:
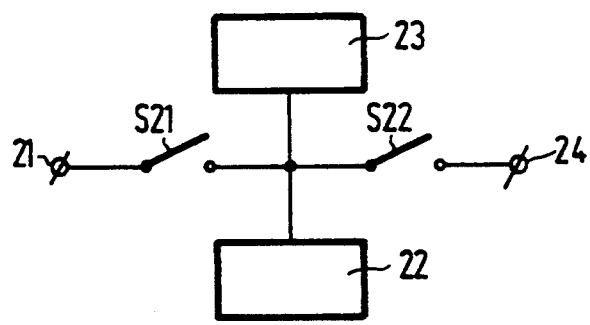
FIG. 2 is a block schematic diagram of an analogue current memory arrangement according to the invention.

The current memory arrangement shown in FIG. 2 has been designed using an alternative principle to the circuit enhancements discussed with respect to the circuit of FIG. 1. The principle is to provide a total error reduction through the operation of the circuit rather than to use the piecemeal application of circuit enhancements to suppress individual errors.

As shown in FIG. 2 the current memory arrangement has an input 21 which is connected via a switch S21 to the inputs of a first (coarse) current memory cell 22 and a second (fine) current memory cell 23. A switch S22 is connected between the first and second current memory cells 21 and 22 and an output 24 of the current memory arrangement.

In operation the process of memorizing the input current applied to input 21 is carried out in two stages. During a first sub-portion of phase $\phi 1$ the input current is sensed and memorized approximately in memory cell 22 and this is followed in a second sub-portion of phase $\phi 1$ by a fine step where the error in the coarse step is derived and memorized in memory cell 23. The output is then delivered from both cells in phase $\phi 2$ so that the output of cell 22 is corrected by the error measured in cell 23 to give an accurate reproduction of the input current.

Figure 3:
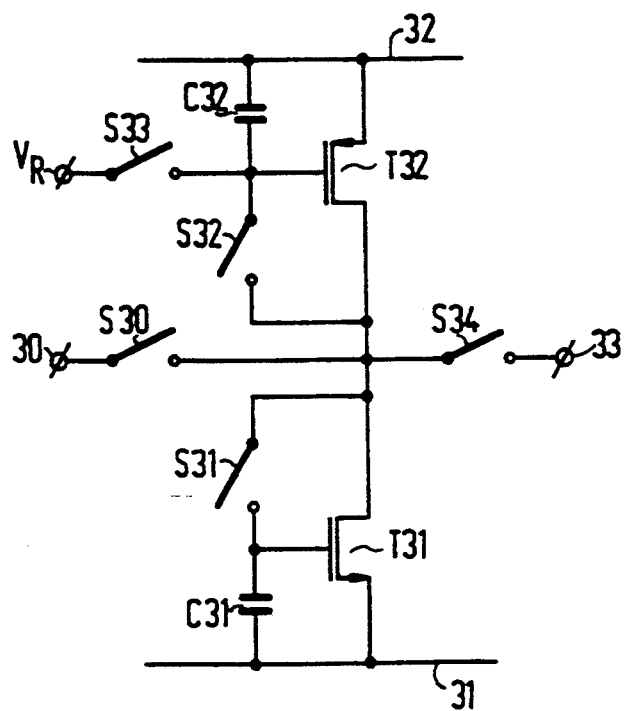
FIG. 3 is a circuit diagram of an analogue current memory arrangement according to the invention.

A circuit arrangement which performs this two step procedure is shown in FIG. 3 and its operation will be described with reference to FIGS. 4 and 5a, 5b and 5c.

As shown in FIG. 3 the current memory arrangement has an input 30 which is connected via a switch S30 to the junction of the drain electrode of an nMOS transistor T31 and a pMOS transistor T32. A switch S31 is connected between the gate and drain electrodes of transistor T31 while a capacitor C31 is connected between its gate and source electrodes. A switch S32 is connected between the gate and drain electrodes of transistor T32 while a capacitor C32 is connected between its gate and source electrodes. A source of reference potential $V_R$ is connected via a switch S33 to the gate electrode of transistor T32. The source electrode of transistor T31 is connected to a negative supply rail 31 while the source electrode of transistor T32 is connected to a positive supply rail 32. The junction of the source electrodes of transistors T31 and T32 is connected via a switch S34 to an output 33.

Figure 4:
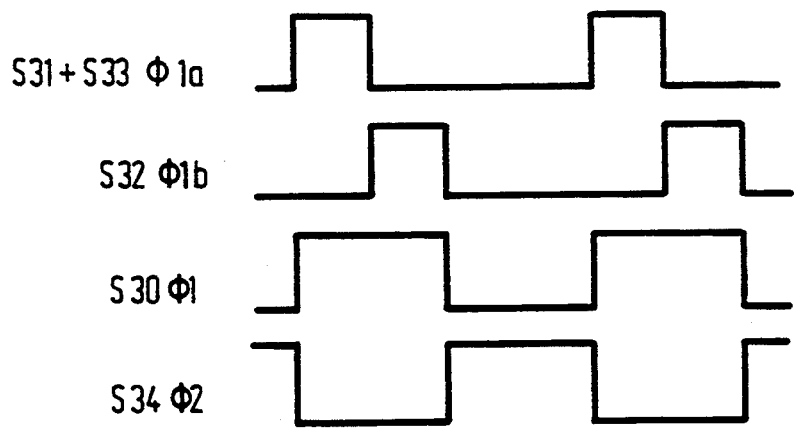
FIG. 4 shows waveforms of clock signals used to control switches in the embodiment of FIG. 3.

In operation switch S30 is closed during a first portion $\phi 1$ of a clock signal, while switches S33 and S33 are closed during a first sub-portion $\phi 1a$ of the first portion $\phi 1$ and switch S32 is closed during a second sub-portion $\phi 1b$ of the first portion $\phi 1$. The switch S34 is closed during a second portion $\phi 2$ of the clock signal. The relative phasing of the clock signals is shown in FIG. 4.

Figures 5A, 5B, 5C:
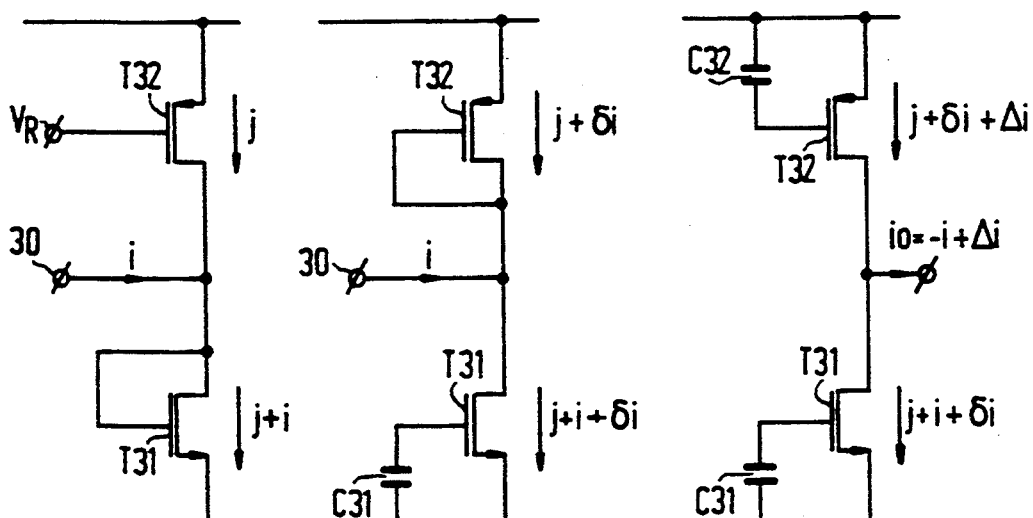
FIGS. 5a, 5b and 5c illustrates the operation of the analogue current memory shown in FIG. 3.

Transistor T31, switch S31, and capacitor C31 form a coarse memory which senses the input current during sub-portion $\phi 1a$ of the clock signal. At this time, as illustrated by FIG. 5a transistor T32 acts as a bias current source producing a bias current j who magnitude is dependent on the reference voltage $V_R$. At the end of sub-portion $\phi 1a$ switch S31 is opened and transistor T31 passes a current $i+j+\delta i$ where $\delta i$ is the signal dependent error current resulting from charge injection in transistor T31, incomplete settling during sub-portion $\phi 1a$, and sampled noise. During sub-portion $\phi 1b$ transistor T32 is connected as a diode (switch S32 is closed and switch S33 opened as illustrated in FIG. 5b). Signal current i is still flowing into the input and through switch S30 and consequently current through transistor 832 settles towards $j+\delta i$. At the end of sub-portion $\phi 1b$ the voltage at the drain electrodes of transistors T31 and T32 will be close to the value with no signal present (i=0) since $\delta i$ is very much less than j. That is the circuit develops a voltage at the drain electrodes of the memory transistors T31 and T32 which is equivalent to a virtual ground.

During the portion $\phi 2$ switch S32 opens and S34 is closed. As switch S32 opens an extra error $\Delta i$ occurs in the fine memory (T32,S32,C32), mainly due to charge injection, and an output current of $-i+\Delta i$ is generated and passed through switch S34 to the output 33 as shown in FIG. 5c. If the output is fed to a second cell of similar type but operating on clock portions $\phi 2$, $\phi 2a$, $\phi 2b$ and $\phi 1$, the second cell establishes a similar "virtual ground" voltage at its input during sub-portion $\phi 2b$. The drain electrodes of transistors T31 and T32 will consequently be held at nearly the same voltage during both the input sub-portion $\phi 1b$ and the output portion $\phi 2$ (or at least sub-portion $\phi 2b$). This is equivalent to the condition established by negative feedback in conventional current memory cells. Further, because the current in the fine memory transistor (T32) and the voltage on its switch (S32) are similarly constant during these portions the charge injection error of the fine memory is nearly independent of input signal, that is $\Delta i$ approximates to an offset error. Unlike the signal dependent errors in the coarse memory transistor T31 (and in conventional cells) an offset error is less serious since in circuits employing pairs of cells, for example integrator loops, delay cells, etc., the offset of the first cell is nearly cancelled by that of the second. Clearly the signal is transmitted through the memory arrangement with an error $\Delta i$ resulting from the intermediate error $\delta i$ rather than the full input signal current i.

We claim:

1. An analog current memory arrangement comprising an input for receiving an input current, an output for providing an output current reproducing one of the input current and a current related thereto, first and second current memory cells, and current combining means, wherein the first current memory cell comprises means for sensing the input current during a first sub-portion of a first portion of a clock period and means for reproducing the sensed current as an output current during a second sub-portion of the first portion of the clock period, the second current memory cell comprises means for sensing the sum of the input current and the output current of the first current memory cell during the second sub-portion, the first and second current memory cells comprise means for reproducing the currents sensed at their inputs to produce first and second output sub-currents during at least one of a second later portion of said clock period and a later clock period, the current combining means is arranged to combine the first and second output sub-currents, and means are provided for applying the combined sub-currents to the current output.

2. An analog current memory arrangement as claimed in claim 1, in which the first and second memory cells each comprise an MOS transistor having its gate and drain electrodes coupled via a switch, the switch being responsive to the clock signal, each cell operating to sense an input current when its associated switch is closed and produce an output current when its associated switch is open.

3. An analog current memory arrangement as claimed in claim 2, in which the second current memory cell is arranged to provide a constant bias current during the first sub-portion, the bias current being fed together with the input current to the first memory cell.

4. An analog current memory arrangement as claimed in claim 3, comprising means for connecting the gate electrode of the transistor in the second current memory cell to a bias potential source during the first sub-portion.

* * * * *